(12) United States Patent
Hewett et al.

(10) Patent No.: US 6,595,830 B1
(45) Date of Patent: Jul. 22, 2003

(54) METHOD OF CONTROLLING CHEMICAL MECHANICAL POLISHING OPERATIONS TO CONTROL EROSION OF INSULATING MATERIALS

(75) Inventors: Joyce S. Oey Hewett, Austin, TX (US); Gerd Franz Christian Marxsen, Radebeul (DE); Anthony J. Toprac, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 128 days.

(21) Appl. No.: 09/817,532

(22) Filed: Mar. 26, 2001

(51) Int. Cl.$^7$ ............................................. B24B 51/00
(52) U.S. Cl. ............................. 451/5; 451/41; 451/57
(58) Field of Search ........................... 451/5, 6, 8, 41, 451/288, 287, 57; 364/474.06; 437/245

(56) References Cited

U.S. PATENT DOCUMENTS

| | | | |
|---|---|---|---|
| 5,222,329 A | * 6/1993 | Yu | 451/8 |
| 5,245,794 A | * 9/1993 | Salugsugan | 451/5 |
| 5,659,492 A | * 8/1997 | Li et al. | 451/41 |
| 5,676,587 A | * 10/1997 | Landers et al. | 451/57 |
| 6,274,478 B1 | * 8/2001 | Farkas et al. | 438/626 |
| 6,276,987 B1 | * 8/2001 | Li et al. | 451/5 |
| 6,435,942 B1 | * 8/2002 | Jin et al. | 451/8 |

* cited by examiner

Primary Examiner—Robert A. Rose
(74) Attorney, Agent, or Firm—Williams, Morgan & Amerson, P.C.

(57) ABSTRACT

The present invention is directed to a method of polishing wafers on a polishing tool comprised of first, second and third platens. The method comprises providing a wafer having a patterned layer of insulating material, a barrier metal layer, and a metal layer formed above the wafer, performing a first polishing operation on the wafer at the first platen to remove a majority of the metal layer above the barrier metal layer, and performing an endpoint polishing operation on the wafer at the second platen to remove at least some of the metal layer. The method further comprises performing a timed overpolish operation on the wafer at the second platen after the endpoint polishing operation is completed at the second platen, performing a timed polishing operation on the wafer at the third platen to remove at least some of the barrier metal layer, determining an erosion rate of the patterned layer of insulating material, providing the determined erosion rate to a controller that determines a duration of the timed overpolish operations to be performed on at least one subsequently processed wafer at the second platen, and performing the timed overpolish operation on the at least one subsequently processed wafer at the second platen for the duration determined by the controller.

26 Claims, 4 Drawing Sheets

METHOD OF CONTROLLING CHEMICAL MECHANICAL POLISHING OPERATIONS TO CONTROL EROSION OF INSULATING MATERIALS

BACKGROUND OF THE INVENTION

1. Field of the Invention

The present invention is generally directed to the field of semiconductor manufacturing, and, more particularly, to a method of controlling chemical mechanical polishing operations to control erosion of insulating materials.

2. Description of the Related Art

In modem integrated circuit devices, millions of transistors are formed above a surface of a semiconducting substrate. To perform their intended functions, these transistors, or groups of transistors, are electrically coupled together by many levels of conductive inter-connections, i.e., conductive metal lines and plugs. These conductive lines and plugs allow electrical signals to propagate throughout the integrated circuit device.

In general, these conductive interconnections are formed in layers of insulating material, e.g., silicon dioxide, HSQ, or other materials that may have a dielectric constant less than approximately 4. The insulating materials electrically isolate the various conductive interconnections and tend to reduce capacitive coupling between adjacent metal lines when the integrated circuit device is in operation. Moreover, modem integrated circuit devices are very densely packed, i.e., there is very little space between the semiconductor devices, as well as between the conductive metal lines. Accordingly, the amount of insulating material positioned between adjacent metal lines, and other surrounding conductive structures, both above and below the metal lines, is very important.

However, in the course of forming modem conductive lines and plugs, particularly out of copper, chemical mechanical polishing processes are used whereby the insulating material, e.g., silicon dioxide, between the conductive lines is lost or eroded away. Such erosion of the insulating material is undesirable due to its important function in modem integrated circuit devices.

The present invention is directed to a method that solves, or at least reduces, some or all of the aforementioned problems.

SUMMARY OF THE INVENTION

The present invention is directed to a method of controlling chemical mechanical polishing operations to control erosion of insulating materials. In one embodiment, the method comprises providing a wafer having a patterned layer of insulating material, a barrier metal layer, and a metal layer formed above the wafer, performing a first polishing operation on the wafer at a first polishing platen of the tool to remove a majority of the metal layer above the barrier metal layer, and performing an endpoint polishing operation on the wafer at a second polishing platen of the tool to remove at least some of the metal layer. The method further comprises performing a timed overpolish operation on the wafer at the second platen after the endpoint polishing operation is completed at the second platen, and performing a timed polishing operation on the wafer at a third polishing platen of the tool to remove substantially all of the barrier metal layer. The method concludes with the step of determining an erosion rate of the patterned layer of insulating material, providing the determined erosion rate to a controller that determines a duration of the timed overpolish operations to be performed on at least one subsequently processed wafer at the second platen, and performing the timed overpolish operation on the at least one subsequently processed wafer at the second platen for the duration determined by the controller.

BRIEF DESCRIPTION OF THE DRAWINGS

The invention may be understood by reference to the following description taken in conjunction with the accompanying drawings, in which like reference numerals identify like elements, and in which.

Figure 1:
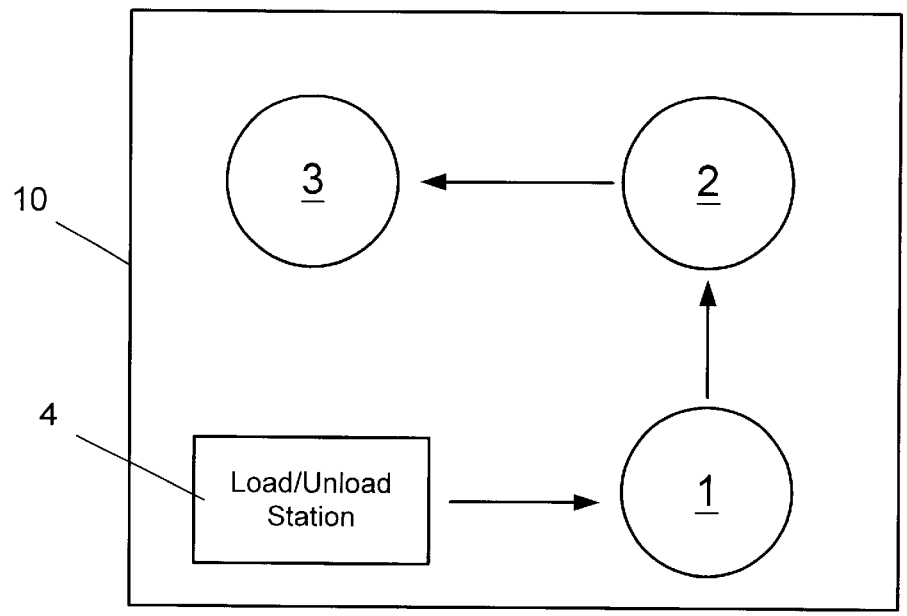
FIG. 1 is schematic view of a polishing tool that may be used with the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention.

In general, the present invention is directed to an automated method of controlling chemical mechanical polishing operations to control the erosion of insulating material. As will be readily apparent to those skilled in the art upon a complete reading of the present application, the present method is applicable to a variety of technologies, e.g., NMOS, PMOS, CMOS, etc., is readily applicable to a variety of devices, including, but not limited to, logic devices, memory devices, etc.

FIG. 1 is a schematic description of an Applied Materials Mirra copper polishing tool, a polishing tool 10 that may be used with the present invention. The Applied Materials tool may be purchased from Applied Materials located in Santa Clara, Calif. The polishing tool 10 is comprised of three polishing platens, platen 1, platen 2 and platen 3, and a load/unload station 4. The polishing tool 10 may be used in forming conductive interconnections comprised of copper in modem integrated circuit devices. In general, as described more fully below, each wafer is subjected to various polishing operations at each of the platens 1–3. Wafers are processed at all four stations, i.e., platens 1–3 and the load/unload station 4, in parallel. After completion of the longest process time, all wafers are moved to the next station.

Figure 2:
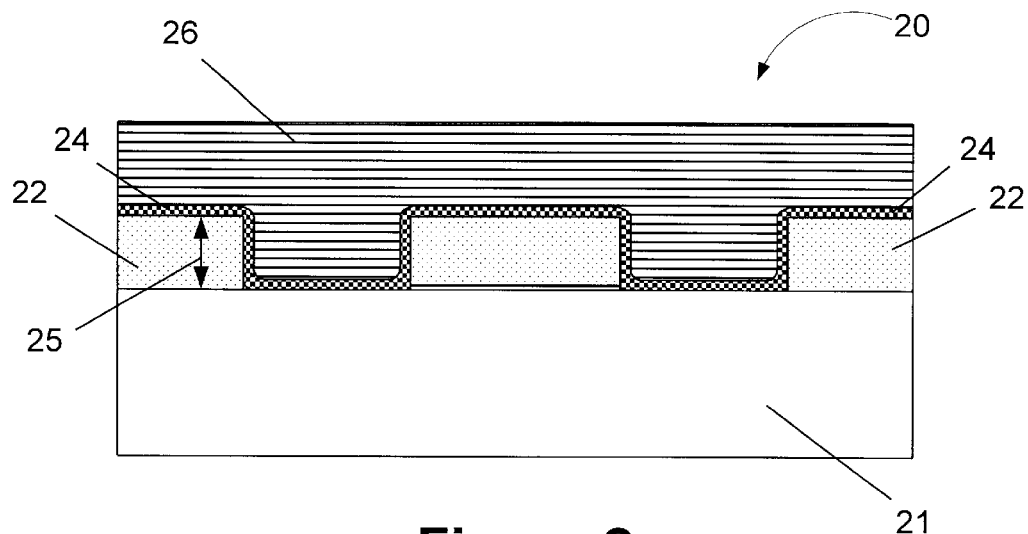
FIG. 2 is a cross-sectional view of a partially formed integrated circuit device comprised of a layer of metal formed above a patterned layer of insulating material.
Figure 3:
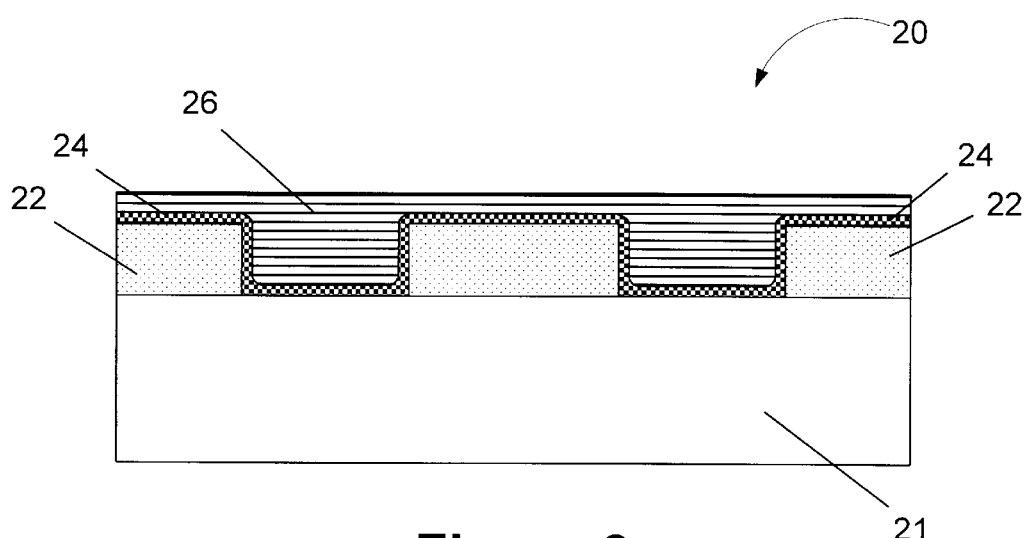
FIGS. 3 is a cross-sectional view of the device shown in FIG. 2 after a majority of the layer of metal has been removed at a first polishing platen of the polishing tool.

FIGS. 2–6 are cross-sectional views of a partially formed integrated circuit device that will be used to describe the various polishing operations performed at each of the platens 1–3. As shown in FIG. 2, the partially formed integrated circuit device 20 is comprised of a patterned layer of insulating material 22 formed above a structure 21, a barrier metal layer 24, and a layer of metal 26, e.g., copper. The patterned layer of insulating material 22 has a thickness 25, as shown in FIG. 2. The structure 21 is intended to be representative in nature in that it may be a semiconducting substrate, a previously formed layer of material, e.g., a layer of silicon dioxide, or a previously formed stack of layers of insulating material having a plurality of conductive interconnections formed in each layer.

The various layers depicted in FIG. 2 may be comprised of a variety of materials, and they may be formed by a variety of techniques. For example, the structure 21 may be a previously formed layer of silicon dioxide that is formed by a chemical vapor deposition ("CVD") process using TEOS as a constituent gas, and it may have a thickness ranging, for example, from approximately 1000–3000 nm. The patterned layer of insulating material 22 may be formed from a variety of materials, e.g., silicon dioxide, silicon nitride, HSQ, materials having a dielectric constant less than 3, etc., and it may have a thickness ranging, for example, from approximately 500–1500 nm. The patterned layer of insulating material 22 may be formed by blanket depositing a layer of insulating material, and, thereafter, patterning the layer of material using known photolithography and etching techniques to result in the patterned layer of insulating material 22 shown in FIG. 2.

Thereafter, the barrier metal layer 24 may be conformally deposited above the patterned layer of insulating material 22 using a variety of process methods, e.g., CVD, plasma enhanced CVD ("PECVD"), physical vapor deposition ("PVD"), sputtering, etc. The barrier metal layer 24 may be comprised of a variety of materials, and its thickness may vary. In one illustrative embodiment, where conductive interconnections comprised of copper are being formed, the barrier metal layer 24 is comprised of tantalum, and it may have a thickness ranging, for example, from approximately 10–30 nm.

Thereafter, the metal layer 26 comprised of, for example, copper, is formed above the barrier metal layer 24 by known electroplating techniques. Typically, in the case where the metal layer 26 is comprised of copper, this process involves the formation of a copper seed layer (not shown) above the barrier metal layer 24, and, thereafter, positioning the partially formed integrated circuit device 20 in an electroplating bath to form the metal layer 26 comprised of copper. The copper layer 26 may have a thickness (above the patterned insulating layer 22) that ranges, for example, from approximately 500–1500 nm.

The present invention will now be further described with reference to the specific embodiment wherein the metal layer 26 is comprised of copper. At platen 1 of the polishing tool 10, a majority, and typically the bulk, of the copper layer 26 is removed. A relatively high polisher arm downforce is used to achieve an aggressive removal rate on the order of approximately 8–16 nm/sec (80–160 Å/sec) of copper. The polishing process performed at platen 1 may be a timed process whereby, in one application, approximately 50–80% of the copper layer 26 above the patterned layer of insulating material 22 is removed. FIG. 2 depicts the wafer after polishing operations have been completed at platen 1.

Figure 4:
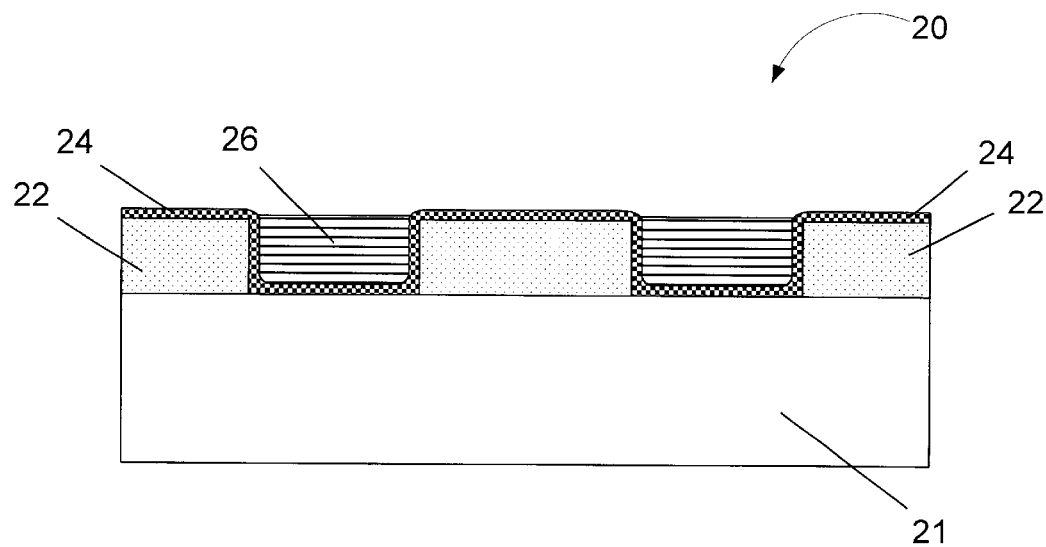
FIG. 4 is a cross-sectional view of the device shown in FIG. 3 after an endpoint polishing operation has been performed at a second polishing platen of the polishing tool.
Figure 5:
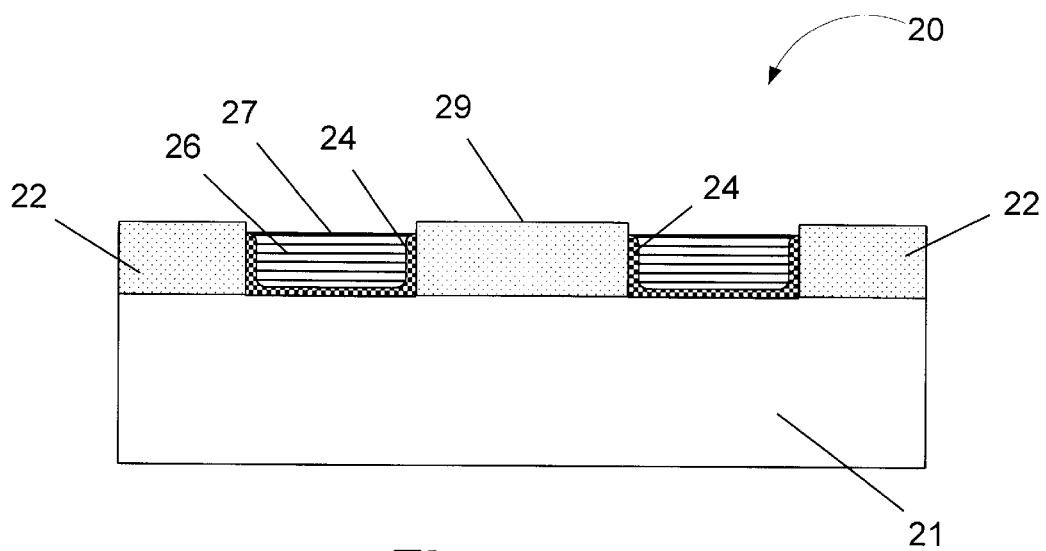
FIG. 5 is a cross-sectional view of the device shown in FIG. 4 after further timed polishing operations have been performed at the second polishing platen.
Figure 6:
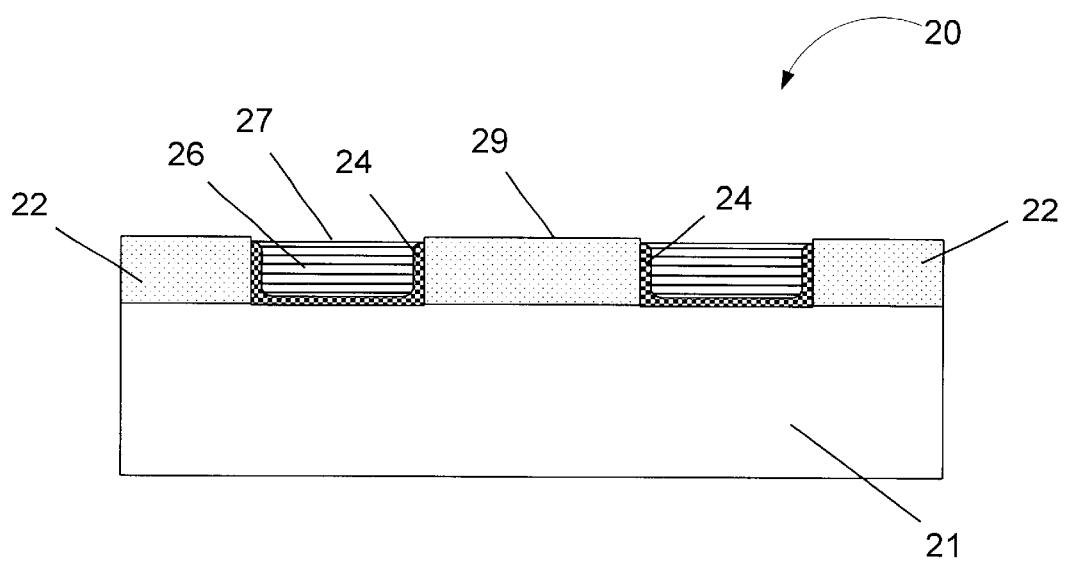
FIG. 6 is a cross-sectional view of the device shown in FIG. 5 after additional polishing operations are performed at a third polishing platen of the polishing tool.

At platen 2, the remaining copper layer 26 is removed at a much slower rate, e.g., on the order of approximately 6–10 nm/sec (60–100 Å/sec) by the use of a lower downforce pressure. This is an endpoint process that is stopped when an optical sensor on the polishing tool 10 detects when all of the copper has been removed, at least in the area where the optical sensor is focused, thereby exposing the barrier metal layer 24. This situation is depicted in FIG. 4. Thereafter, a timed overpolish process is performed for a set duration. This overpolish process is used to remove residual copper, as the endpoint process is not perfect, and to begin removing the barrier metal layer 24. FIG. 5 depicts the wafer after the timed overpolishing operations have been completed at platen 2 and a relatively small portion of the barrier metal layer 24 above the patterned layer of insulating material 22 is removed. Note that, at this point in the process, the surface 27 of the copper layer 26 is lower than the surface 29 of the insulating material layer 22 due to the overpolishing process selectively removing more of the copper layer 26 than the barrier metal layer 24.

At platen 3, a timed polishing process is performed to insure complete removal of the remaining portion of the barrier metal layer 24. See FIG. 6. During this process, some of the underlying layer of insulating material 22 is also removed. In some processing recipes, there may be a targeted erosion of the patterned layer of insulating material 22 of approximately 30 nm, for example, during this process.

However, for a variety of reasons, the erosion of the patterned insulating layer 22 tends to vary and may be larger than anticipated. There are numerous reasons why the erosion of the patterned layer of insulating material 22 may exceed the targeted erosion value. For example, the initial copper layer 26 may be formed thinner than anticipated. In this situation, the entirety of the copper layer 26 above the insulating layer 22 may be removed on platen 1 with most or all of the barrier metal layer 24 being removed on platen 2, resulting in more than nominal amounts of the patterned layer of insulating material 22 being removed at platen 3. Alternatively, the thinner copper layer 26 may result in a thinner than anticipated residual layer of copper to be removed at platen 2 during the initial endpoint process performed at that platen. Moreover, the optical sensor used for endpoint detection may not accurately reflect conditions across the surface of the wafer. For example, the endpoint detector may indicate that more copper needs to be removed when there are areas of the wafer in which the copper has already been removed. They may be the result of the copper layer 26 having various thicknesses across the surface of the wafer. Additionally, the window through which the optical sensor obtains its information may become dirty or fogged, thereby leading to erroneous readings. Lastly, the layer of barrier metal 24 may be thinner than anticipated. Thus, when the timed polish process is performed at platen 3, excess insulating material may be removed from the insulating layer 22.

The present invention is directed to a control methodology for reducing or eliminating unwanted erosion of the patterned insulating layer 22. In general, the method involves adjusting the duration of the overpolish process performed at platen 2 to control the erosion of the insulating layer 22.

The erosion of the insulating layer 22 may be expressed by the following equation:

$$E = m_e(t_{op}) + b$$

In the above equation, "E" is the erosion of the insulating layer 22; "$m_e$" is the erosion rate of the insulating layer 22; "$t_{op}$" is the duration of the overpolishing operation performed at platen 2; and "b" is a constant that recognizes that, in virtually all polishing operations, there will be some amount of erosion of the insulating layer 22 despite all efforts to prevent it.

As an initial matter, the magnitude of the erosion of the insulating layer 22 may be determined by estimation or measurement. For example, an assumption may be made as to the thickness 25 of the incoming patterned layer of insulating material 22 prior to forming the barrier metal layer 24 and the copper layer 26. After all polishing operations are completed, the thickness 25 of the insulating layer 22 may be measured using an appropriate metrology tool, such as an ellipsometer. Based upon the difference between assumed thickness and the measured post-polish thickness of the insulating layer 22, an erosion rate "$m_e$" may be established based upon the duration ("$t_{op}$") of the overpolish operations performed at platen 2. Knowing this rate, the duration of the overpolish operations on subsequently processed wafers may be varied. Alternatively, the thickness 25 of the incoming patterned layer of insulating material 22 may be measured using an appropriate metrology tool. The rate of erosion is then determined based upon the difference between the pre-polish and post-polish thicknesses 25 of the patterned layer of insulating material 22.

Figure 7:
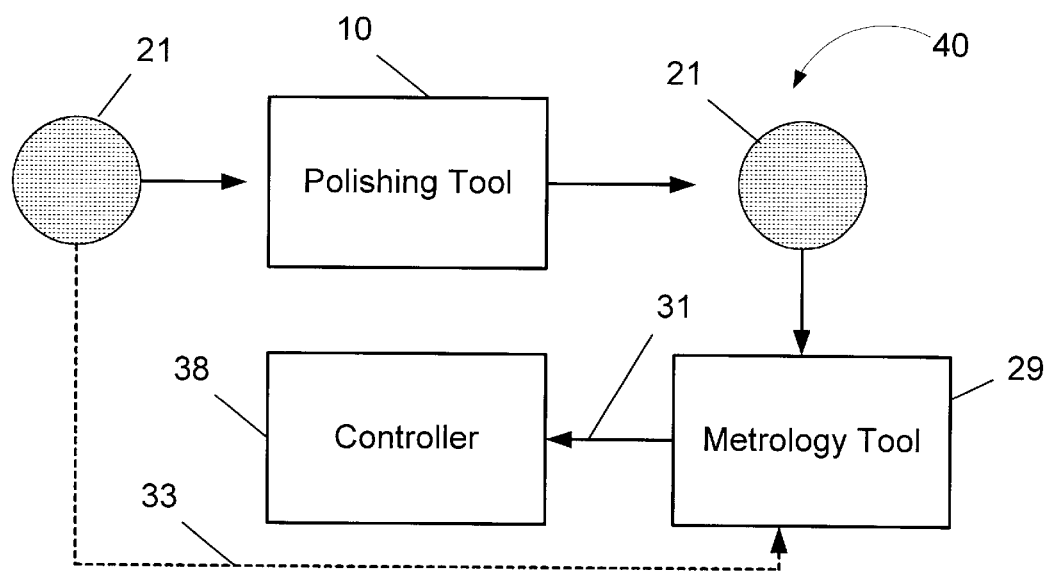
FIG. 7 is a schematic depiction of one embodiment of a system in which the present invention may be employed.

An illustrative system 40 that may be used in one embodiment of the present invention is shown in FIG. 7. The system 40 is comprised of a polishing tool 10, an illustrative metrology tool 29, and a controller 38. As indicated in FIG. 7, one or more wafers 21, having a layer of metal 26 formed above an underlying patterned insulating layer 22 are provided to the polishing tool 10. The wafer 21 is subjected to the polishing operations described herein in the polishing tool 10.

Thereafter, using one or more metrology tools 29, multiple measurements are made of the thickness 25 of the layer of insulating material 22 at various locations across the surface of the wafer 21 after polishing operations are completed in the polishing tool 10. This measurement data is provided to the controller 38 via line 31. Then, in one embodiment, based upon the post-polish thickness measurements of the layer of insulation material 22 and an assumed incoming thickness of the patterned layer of insulating material 22, as well as the duration of the timed overpolish process performed at platen 2, the controller determines an erosion rate "$m_e$" of the layer of insulating material 22. If the post-polish measurements of the insulating layer 22 indicate that the erosion of insulating layer 22 exceeds acceptable limits, the controller 38 may then determine a new duration for the timed overpolish process performed at platen 2, e.g., the duration of the overpolish process performed at platen 2 may be decreased.

In another embodiment, the incoming thickness 25 of the patterned layer of insulating material 22 may actually be measured by the metrology tool 29, as indicated by dashed line 33. This information may then be provided to the controller 38. In this embodiment, the controller 38 may use the difference in the pre-polish and post-polish thickness measurements of the insulating material layer 22 in determining the erosion rate of the insulating material layer 22.

The thickness measurements of the layer of insulating material 22, both pre-polish and post-polish, may be performed on any desired number of wafers. For example, such measurements may be performed on all wafers in one or more lots, or on a representative number of wafers in a given lot, and these results may then be used by the controller 38 in determining variations in the duration of the overpolish operation performed at platen 2. Additionally, more than one lot of wafers may be analyzed until such time as the process engineer has achieved a sufficiently high degree of confidence that the metrology accurately reflects the thickness of the layers of insulating material 22. Moreover, the thickness measurements may be averaged or otherwise statistically manipulated in the controller 38.

In the illustrated embodiment, the controller 38 is a computer programmed with soft-ware to implement the functions described herein. Moreover, the functions described for the controller 38 may be performed by one or more controllers spread through the system. For example, the controller 38 may be a fab level controller that is used to control processing operations throughout all or a portion of a semiconductor manufacturing facility. Alternatively, the controller 38 may be a lower level computer that controls only portions or cells of the manufacturing facility. Moreover, the controller 38 may be a stand-alone device, or it may reside on the tool 30 or on a photolithography module (not shown). However, as will be appreciated by those of ordinary skill in the art, a hardware controller (not shown) designed to implement the particular functions may also be used.

Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the actions and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

An exemplary software system capable of being adapted to perform the functions of the controller 38, as described, is the Catalyst system offered by KLA Tencor, Inc. The Catalyst system uses Semiconductor Equipment and Materials International (SEMI) Computer Integrated Manufacturing (CIM) Framework compliant system technologies, and is based on the Advanced Process Control (APC) Framework. CIM (SEMI E81-0699—Provisional Specification for CIM Framework Domain Architecture) and APC (SEMI E93-0999—Provisional Specification for CIM Framework Advanced Process Control Component) specifications are publicly available from SEMI.

The present invention is directed to a method of polishing wafers on a polishing tool comprised of first, second and third platens, i.e., platens 1–3. The method comprises providing a wafer 21 having a patterned layer of insulating material 22, a barrier metal layer 24, and a metal layer 26 formed above the wafer, performing a first polishing operation on the wafer at the first platen 1 to remove a majority of the metal layer 26 above the barrier metal layer 24, and performing an endpoint polishing operation on the wafer at the second platen 2 to remove at least some of the metal layer 26. The method further comprises performing a timed overpolish operation on the wafer 21 at the second platen 2 after the endpoint polishing operation is completed at the second platen 2, performing a timed polishing operation on the wafer 21 at the third platen 3 to remove at least some of the barrier metal layer 24, determining an erosion rate of the patterned layer of insulating material 22, providing the determined erosion rate to a controller 38 that determines a duration of the timed overpolish operations to be performed on at least one subsequently processed wafer at the second platen 2, and performing the timed overpolish operation on the at least one subsequently processed wafer at the second platen 2 for the duration determined by the controller 38.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of polishing performed on a polishing tool comprised of first, second and third platens, the method comprising:

providing a wafer having a patterned layer of insulating material, a barrier metal layer, and a metal layer formed above said wafer;

performing a first polishing operation on said wafer at said first platen to remove a majority of said metal layer above said barrier metal layer;

performing an endpoint polishing operation on said wafer at said second platen to remove at least some of said metal layer;

performing a timed overpolish operation on said wafer at said second platen after said endpoint polishing operation is completed at said second platen;

performing a timed polishing operation on said wafer at said third platen to remove substantially all of said barrier metal layer;

determining an erosion rate of said patterned layer of insulating material;

providing said determined erosion rate to a controller that determines a duration of the timed overpolish operations to be performed on at least one subsequently processed wafer at said second platen; and performing said timed overpolish operation on said at least one subsequently processed wafer at said second platen for the duration determined by said controller.

2. The method of claim 1, wherein providing a wafer having a patterned layer of insulating material, a barrier metal layer, and a metal layer formed above said wafer comprises providing a wafer having a patterned layer of insulating material comprised of silicon dioxide, a barrier metal layer comprised of tantalum, and a metal layer comprised of copper formed above said wafer.

3. The method of claim 1, wherein performing a first polishing operation on said wafer at said first platen to remove the majority of said metal layer above said barrier metal layer comprises performing a first polishing operation on said wafer at said first platen to remove at least 50% of said metal layer above said barrier metal layer.

4. The method of claim 1, wherein performing an endpoint polishing operation on said wafer at said second platen to remove at least some of said metal layer comprises performing an optically-sensed endpoint polishing operation on said wafer at said second platen to remove at least some of said metal layer.

5. The method of claim 1, wherein determining an erosion rate of said patterned layer of insulating material comprises determining an erosion rate of said patterned layer of insulating material based upon the difference between an assumed thickness of said patterned layer of insulating material prior to performing any polishing operations and a measured thickness of said patterned layer of insulating material after polishing operations at said third platen are complete.

6. The method of claim 1, wherein determining an erosion rate of said patterned layer of insulating material comprises determining an erosion rate of said patterned layer of insulating material based upon the difference between a measured thickness of said patterned layer of insulating material prior to performing any polishing operations and a measured thickness of said patterned layer of insulating material after polishing operations at said third platen are complete.

7. A method of polishing performed on a polishing tool comprised of first, second and third platens, the method comprising:

providing a wafer having a patterned layer of insulating material, a barrier metal layer comprised of tantalum, and a metal layer comprised of copper formed above said wafer;

performing a first polishing operation on said wafer at said first platen to remove a majority of said metal layer above said barrier metal layer;

performing an endpoint polishing operation on said wafer at said second platen to remove at least some of said metal layer;

performing a timed overpolish operation on said wafer at said second platen after said endpoint polishing operation is completed at said second platen;

performing a timed polishing operation on said wafer at said third platen to remove substantially all of said barrier metal layer;

determining an erosion rate of said patterned layer of insulating material;

providing said determined erosion rate to a controller that determines a duration of the timed overpolish operations to be performed on at least one subsequently processed wafer at said second platen; and performing said timed overpolish operation on said at least one subsequently processed wafer at said second platen for the duration determined by said controller.

8. The method of claim 7, wherein providing a wafer having a patterned layer of insulating material comprises providing a wafer having a patterned layer of insulating material comprised of silicon dioxide.

9. The method of claim 7, wherein performing a first polishing operation on said wafer at said first platen to remove the majority of said metal layer above said barrier metal layer comprises performing a first polishing operation on said wafer at said first platen to remove at least 50% of said metal layer above said barrier metal layer.

10. The method of claim 7, wherein performing an endpoint polishing operation on said wafer at said second platen to remove at least some of said metal layer comprises performing an optically-sensed endpoint polishing operation on said wafer at said second platen to remove at least some of said metal layer.

11. The method of claim 7, wherein determining an erosion rate of said patterned layer of insulating material comprises determining an erosion rate of said patterned layer of insulating material based upon the difference between an assumed thickness of said patterned layer of insulating material prior to performing any polishing operations and a measured thickness of said patterned layer of insulating material after polishing operations at said third platen are complete.

12. The method of claim 7, wherein determining an erosion rate of said patterned layer of insulating material comprises determining an erosion rate of said patterned layer of insulating material based upon the difference between a measured thickness of said patterned layer of insulating material prior to performing any polishing operations and a measured thickness of said patterned layer of insulating material after polishing operations at said third platen are complete.

13. A method of polishing performed on a polishing tool comprised of first, second and third platens, the method comprising:

providing a wafer having a patterned layer of silicon dioxide, a barrier metal layer comprised of tantalum, and a metal layer comprised of copper formed above said wafer;

performing a first polishing operation on said wafer at said first platen to remove at least 85% of said metal layer above said barrier metal layer;

performing an endpoint polishing operation on said wafer at said second platen to remove at least some of said metal layer;

performing a timed overpolish operation on said wafer at said second platen after said endpoint polishing operation is completed at said second platen;

performing a timed polishing operation on said wafer at said third platen to remove substantially all of said barrier metal layer;

determining an erosion rate of said patterned layer of insulating material;

providing said determined erosion rate to a controller that determines a duration of the timed overpolish operations to be performed on at least one subsequently processed wafer at said second platen; and performing said timed overpolish operation on said at least one subsequently processed wafer at said second platen for the duration determined by said controller.

14. The method of claim 13, wherein performing an endpoint polishing operation on said wafer at said second platen to remove at least some of said metal layer comprises performing an optically-sensed endpoint polishing operation on said wafer at said second platen to remove at least some of said metal layer.

15. The method of claim 13, wherein determining an erosion rate of said patterned layer of insulating material comprises determining an erosion rate of said patterned layer of insulating material based upon the difference between an assumed thickness of said patterned layer of insulating material prior to performing any polishing operations and a measured to thickness of said patterned layer of insulating material after polishing operations at said third platen are complete.

16. The method of claim 13, wherein determining an erosion rate of said patterned layer of insulating material comprises determining an erosion rate of said patterned layer of insulating material based upon the difference between a measured thickness of said patterned layer of insulating material prior to performing any polishing operations and a measured thickness of said patterned layer of insulating material after polishing operations at said third platen are complete.

17. A method of polishing performed on a polishing tool, comprising:

providing a wafer having a patterned layer of insulating material, a barrier metal layer, and a metal layer formed above said wafer;

performing a first polishing operation on said wafer to remove a majority of said metal layer above said barrier metal layer;

performing an endpoint polishing operation and a timed overpolish operation on said wafer, said timed overpolish operation being performed after said endpoint polishing operation is completed;

determining an erosion rate of said patterned layer of insulating material;

providing said determined erosion rate to a controller that determines a duration of the timed overpolish operations to be performed on at least one subsequently processed wafer; and performing said timed overpolish operation on said at least one subsequently processed wafer for the duration determined by said controller.

18. The method of claim 17, wherein providing a wafer having a patterned layer of insulating material, a barrier metal layer, and a metal layer formed above said wafer comprises providing a wafer having a patterned layer of insulating material comprised of silicon dioxide, a barrier metal layer comprised of tantalum, and a metal layer comprised of copper formed above said wafer.

19. The method of claim 17, wherein said first polishing operation is performed at a first platen of said polishing tool.

20. The method of claim 17, wherein said endpoint polishing operation is performed at a second platen of said polishing tool.

21. The method of claim 17, wherein said timed overpolish operation is performed at a second platen of said polishing tool.

22. The method of claim 17, further comprising performing a timed overpolish operation at a third platen of said polishing tool to remove substantially all of said barrier metal layer.

23. The method of claim 17, wherein performing a first polishing operation on said wafer to remove the majority of said metal layer above said barrier metal layer comprises performing a first polishing operation on said wafer to remove at least 50% of said metal layer above said barrier metal layer.

24. The method of claim 17, wherein performing an endpoint polishing operation on said wafer comprises performing an optically-sensed endpoint polishing operation on said wafer.

25. The method of claim 17, wherein determining an erosion rate of said patterned layer of insulating material comprises determining an erosion rate of said patterned layer of insulating material based upon the difference between an assumed thickness of said patterned layer of insulating material prior to performing any polishing operations and a measured thickness of said patterned layer of insulating material after polishing operations performed at a third platen of said polishing tool are complete.

26. The method of claim 17, wherein determining an erosion rate of said patterned layer of insulating material comprises determining an erosion rate of said patterned layer of insulating material based upon the difference between a measured thickness of said patterned layer of insulating material prior to performing any polishing operations and a measured thickness of said patterned layer of insulating material after polishing operations at a third platen of said polishing tool are complete.

* * * * *